United States Patent
Zang et al.

(10) Patent No.: US 10,103,238 B1
(45) Date of Patent: Oct. 16, 2018

(54) NANOSHEET FIELD-EFFECT TRANSISTOR WITH FULL DIELECTRIC ISOLATION

(71) Applicant: GLOBALFOUNDRIES Inc., Grand Cayman (KY)

(72) Inventors: Hui Zang, Guilderland, NY (US); Tek Po Rinus Lee, Albany, NY (US); Haigou Huang, Rexford, NY (US); Ruilong Xie, Niskayuna, NY (US); Min Gyu Sung, Latham, NY (US); Chanro Park, Clifton Park, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/652,890

(22) Filed: Jul. 18, 2017

(51) Int. Cl.
| | |
|---|---|
| *H01L 21/336* | (2006.01) |
| *H01L 29/423* | (2006.01) |
| *H01L 29/66* | (2006.01) |
| *H01L 21/768* | (2006.01) |
| *H01L 29/06* | (2006.01) |
| *H01L 21/311* | (2006.01) |
| *H01L 29/786* | (2006.01) |
| *H01L 21/02* | (2006.01) |

(52) U.S. Cl.
CPC .. *H01L 29/42392* (2013.01); *H01L 21/02532* (2013.01); *H01L 21/311* (2013.01); *H01L 21/76829* (2013.01); *H01L 29/0673* (2013.01); *H01L 29/6656* (2013.01); *H01L 29/66439* (2013.01); *H01L 29/66545* (2013.01); *H01L 29/66795* (2013.01); *H01L 29/78696* (2013.01); *H01L 21/0228* (2013.01)

(58) Field of Classification Search
CPC .......... H01L 29/0673; H01L 29/42392; H01L 29/66439; H01L 29/66545; H01L 29/6656; H01L 29/66795; H01L 29/78696; H01L 21/0228; H01L 21/02532; H01L 21/311; H01L 21/76829
See application file for complete search history.

(56) References Cited

U.S. PATENT DOCUMENTS

| | | | |
|---|---|---|---|
| 7,229,901 B2 * | 6/2007 | Savage | ............... H01L 21/6835 257/E21.093 |
| 7,518,195 B2 * | 4/2009 | Ernst | ................. H01L 29/42384 257/347 |
| 8,389,416 B2 * | 3/2013 | Luong | ................ H01L 21/6831 438/710 |
| 8,637,849 B2 | 1/2014 | Deligianni et al. | |

(Continued)

*Primary Examiner* — Eric Ward
(74) *Attorney, Agent, or Firm* — Thompson Hine LLP; Yuanmin Cai

(57) ABSTRACT

Methods for forming a structure for a nanosheet field-effect transistor. A body feature is formed that includes a plurality of nanosheet channel layers and a plurality of first sacrificial layers that are alternatingly arranged with the nanosheet channel layers. The body feature is located on a second sacrificial layer. The first sacrificial layers are recessed relative to the nanosheet channel layers to form a plurality of first cavities indented into a sidewall of the body feature. A plurality of dielectric spacers are formed that fill the first cavities. After forming the dielectric spacers, the second sacrificial layer is removed with an etching process to define a second cavity that extends completely beneath the body feature. A dielectric layer is formed in the second cavity.

20 Claims, 8 Drawing Sheets

(56) References Cited

U.S. PATENT DOCUMENTS

| | | | |
|---|---|---|---|
| 9,711,414 B2* | 7/2017 | Hatcher | H01L 21/823807 |
| 9,793,403 B2* | 10/2017 | Obradovic | H01L 29/7849 |
| 9,972,720 B2* | 5/2018 | Bae, II | H01L 29/78609 |
| 2013/0161756 A1 | 6/2013 | Glass et al. | |
| 2014/0091279 A1* | 4/2014 | Kachian | B82Y 10/00 257/27 |
| 2014/0091360 A1 | 4/2014 | Pillariselly et al. | |
| 2016/0126310 A1* | 5/2016 | Rodder | H01L 29/41758 257/9 |
| 2016/0276484 A1* | 9/2016 | Kim | H01L 29/7851 |
| 2017/0194430 A1* | 7/2017 | Wood | H01L 29/0673 |

\* cited by examiner

NANOSHEET FIELD-EFFECT TRANSISTOR WITH FULL DIELECTRIC ISOLATION

BACKGROUND

The present invention relates to semiconductor device fabrication and integrated circuits and, more specifically, to methods of forming a structure for a nanosheet field-effect transistor.

Device structures for a field-effect transistor generally include a body region, a source and a drain defined in the body region, and a gate electrode configured to switch carrier flow in a channel formed during device operation in the body region. When a control voltage exceeding a designated threshold voltage is applied to the gate electrode, carrier flow occurs in an inversion or depletion layer in the channel between the source and drain to produce a device output current. The body region and channel of a planar field-effect transistor are located beneath the top surface of a substrate on which the gate electrode is supported. Other types of field-effect transistors have body regions and channels arranged in physical locations other than beneath the top surface of the substrate.

A fin-type field-effect transistor (FinFET) is a non-planar device structure that may be more densely packed in an integrated circuit than planar field-effect transistors. A FinFET may include a fin consisting of a solid unitary body of semiconductor material, heavily-doped source/drain regions formed in sections of the body, and a gate electrode that wraps about a channel located in the fin body between the source/drain regions. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and reduced power consumption.

Stacked nanowire or nanosheet field-effect transistors have been developed as an advanced type of field-effect transistors that may permit additional increases in packing density. The body of a stacked nanosheet field-effect transistor includes multiple semiconductor nanosheets that are arranged in a three-dimensional array with a gate stack formed on the nanosheet channel regions. The gate stack may surround all sides of the channel region of each individual semiconductor nanosheet in a gate-all-around (GAA) arrangement.

SUMMARY

In embodiments of the invention, a method is provided for forming a field-effect transistor. A body feature is formed that includes a plurality of nanosheet channel layers and a plurality of first sacrificial layers that are alternatingly arranged with the nanosheet channel layers. The body feature is located on a second sacrificial layer. The first sacrificial layers are recessed relative to the nanosheet channel layers to form a plurality of first cavities indented into a sidewall of the body feature. A plurality of dielectric spacers are formed that fill the first cavities. After forming the dielectric spacers, the second sacrificial layer is removed with an etching process to define a second cavity that extends completely beneath the body feature. A dielectric layer is formed in the second cavity.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
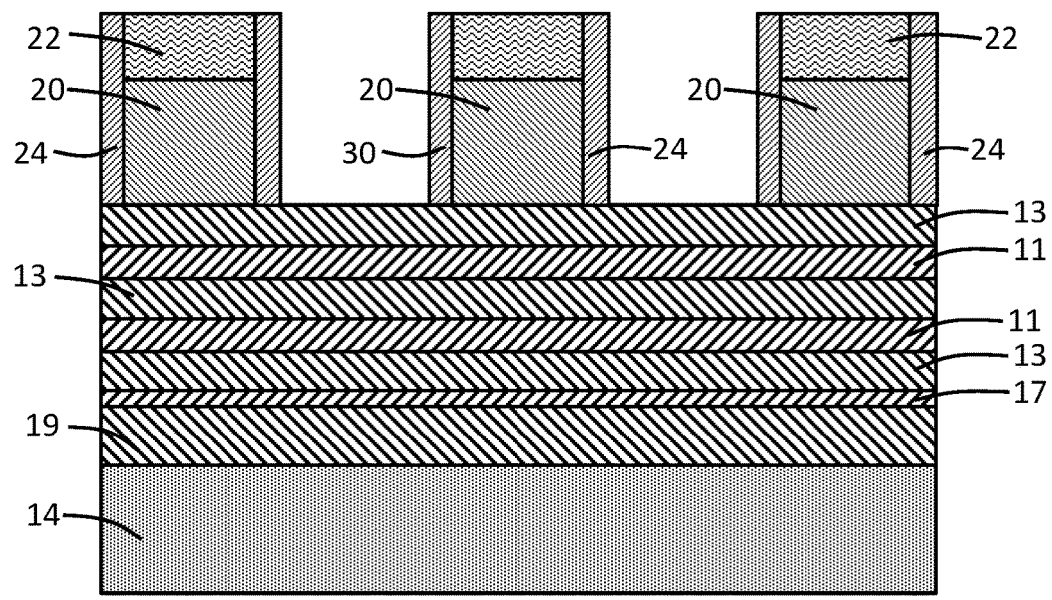
FIGS. 1-8 are cross-sectional views of a device structure at successive fabrication stages of a processing method in accordance with embodiments of the invention.

With reference to FIG. 1 and in accordance with embodiments of the invention, semiconductor layers 11 and semiconductor layers 13 are formed in an alternating sequence as a layer stack on a substrate 14. The semiconductor layers 11 are composed of a semiconductor material, such as silicon (Si), and may provide nanosheets in a completed device structure. The semiconductor layers 13 may be composed of a semiconductor material, such as silicon germanium (SiGe), that is chosen to be removed selective to the semiconductor material of the semiconductor layers 11. In an embodiment, the semiconductor layers 13 may be composed of SiGe with a germanium content of twenty-five percent (25%) to thirty-five percent (35%), and may etch at a higher rate than silicon composing the semiconductor layers 11. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. To generate the layer stack, the semiconductor layers 11, 13 may be sequentially formed by an epitaxial growth process with the composition alternating during growth, and at least the semiconductor layers 11 may be undoped. The number of pairs of the semiconductor layers 11, 13 may differ from the number depicted in the representative embodiment.

The layer stack further includes a semiconductor layer 17 and a semiconductor layer 19 that are arranged vertically between the semiconductor layers 11, 13 and the substrate 14. The semiconductor layer 17 is arranged between the lowermost semiconductor layer 13 in the layer stack and the semiconductor layer 19. The semiconductor layer 17 may have the same composition as the semiconductor layers 11, and may be thinner than the individual semiconductor layers 11. The semiconductor layer 19 may have the same composition as the semiconductor layers 13, and may be thicker than the individual semiconductor layers 13.

Sacrificial gate structures 20 are formed on the top surface of the semiconductor layers 11, 13 in the layer stack. The sacrificial gate structures 20 may be composed of a polycrystalline semiconductor material, such as polycrystalline silicon (polysilicon), that is deposited by CVD and patterned with reactive ion etching (ME). Each sacrificial gate structure 20 is covered by a dielectric cap 22 that is located on its top surface, and dielectric spacers 24 that are located adjacent to its vertical sidewalls. The dielectric spacers 24 may be composed of a low-k dielectric material, such as silicon oxycarbide (SiOC).

Figure 2:
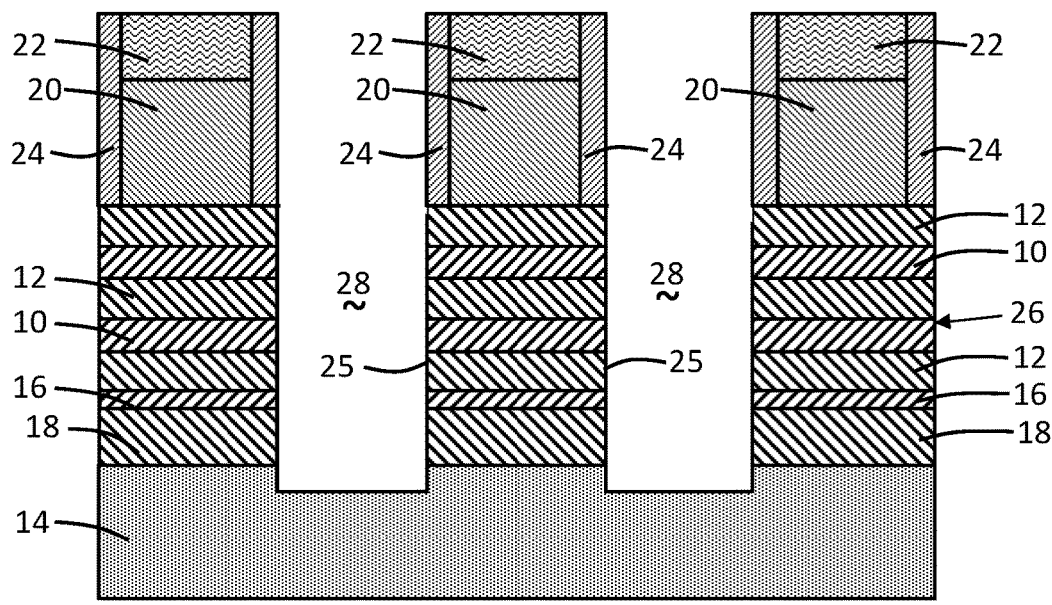

With reference to FIG. 2 in which like reference numerals refer to like features in FIG. 1 and at a subsequent fabrication stage of the processing method, the layer stack is patterned by etching using the sacrificial gate structures 20 and associated dielectric spacers 24 as etch mask during a self-aligned etching process. The etching process, which may be a reactive ion etching (RIE) process, relies one or more etch chemistries to form trenches 28 that extend completely through semiconductor layers 11, 13, 17, 19 and to a shallow depth in the substrate 14. The body feature 26 includes nanosheet channel layers 10 patterned from the semiconductor layers 11 and sacrificial layers 12 patterned from the semiconductor layers 13, as well as an etch block layer 16 patterned from the semiconductor layer 17 and a sacrificial layer 18 patterned from the semiconductor layer 19. The nanosheet channel layers 10 and sacrificial layers 12 adopt the sequencing of the semiconductor layers 11, 13 and similarly alternate with each other in a vertical direction. The nanosheet channel layers 10, sacrificial layers 12, etch block layer 16, and sacrificial layer 18 have vertical sidewalls 25 that may be planar and that define a peripheral boundary.

Figure 3:
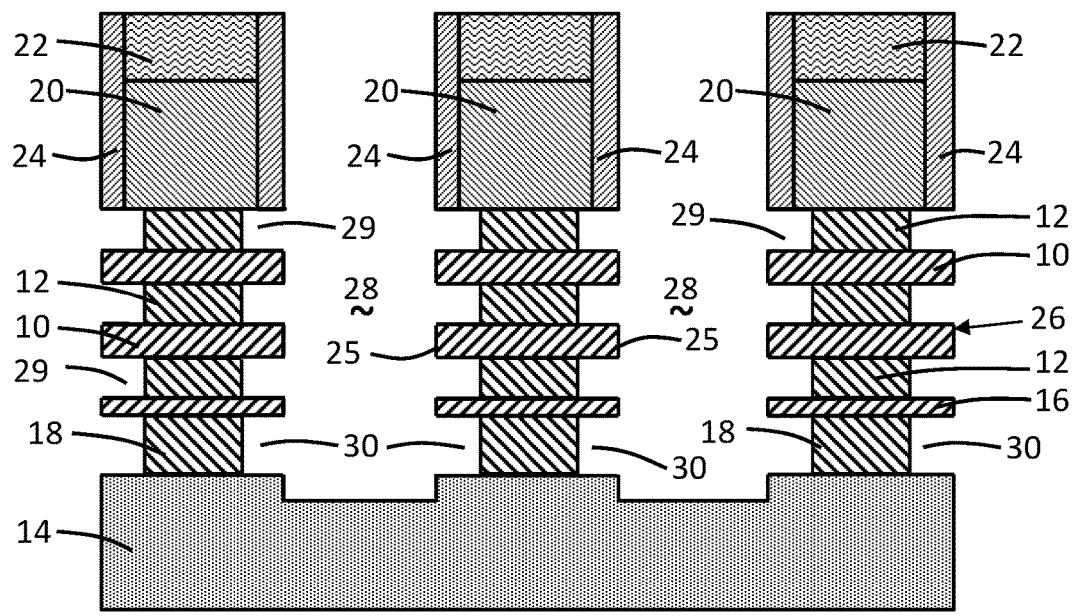

With reference to FIG. 3 in which like reference numerals refer to like features in FIG. 2 and at a subsequent fabrication stage of the processing method, the sacrificial layers 12, 18 are laterally recessed relative to the nanosheet channel layers 10 and the etch block layer 16 at the vertical sidewalls 25 with an isotropic etching process that etches the material constituting the sacrificial layers 12, 18 selective to the material constituting the nanosheet channel layers 10 and etch block layer 16. The sacrificial layers 12, 18 are only partially removed by the etching process. Cavities 29 are formed as indentations in the vertical sidewalls 25 between adjacent pairs of the nanosheet channel layers 10 such that the vertical sidewalls 25 are no longer strictly planar. Cavities 30 are formed as indentations in the vertical sidewalls 25 arranged between the etch block layer 16 and the substrate 14, and that partially undercut each body feature 26. The cavities 30 are wider in a vertical direction than the cavities 29 because the sacrificial semiconductor layer 19 has a thickness that is greater than the individual thicknesses of the semiconductor layers 13.

Figure 4:
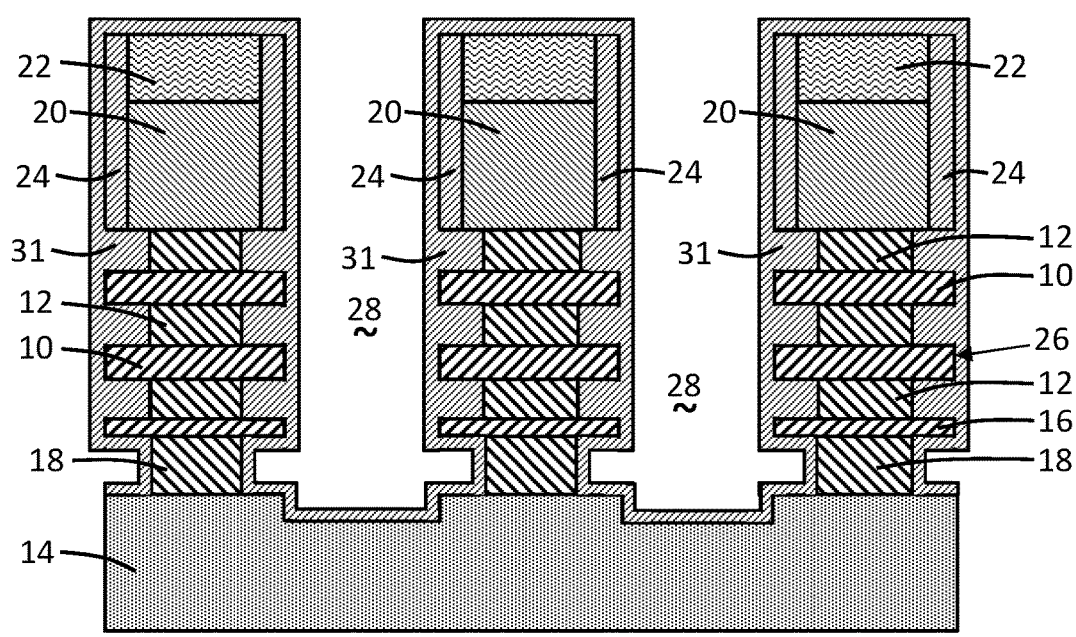

With reference to FIG. 4 in which like reference numerals refer to like features in FIG. 3 and at a subsequent fabrication stage of the processing method, a conformal dielectric layer 31 is applied that fills the cavities 29 by pinch-off and that coats the interior surfaces of the cavities 30 without the occurrence of pinch-off. The conformal dielectric layer 31 also forms on the vertical sidewalls 25, the exterior surfaces of the dielectric cap 22, and the dielectric spacers 24, as well as on the substrate 14 exposed by the trenches 28. The conformal dielectric layer 31 may be composed of a dielectric material, such as silicon nitride ($Si_3N_4$) or a low-k dielectric material, deposited by atomic layer deposition (ALD). The thickness of the conformal dielectric layer 31 and the width of the cavities 30 are selected such that the dielectric material forming inside the cavities 30 does not pinch off during the deposition. The larger thickness of the sacrificial layer 18 relative to the thickness of the sacrificial layers 12 contributes to the wider cavities 30 and therefore to pinch-off prevention.

Figure 5:
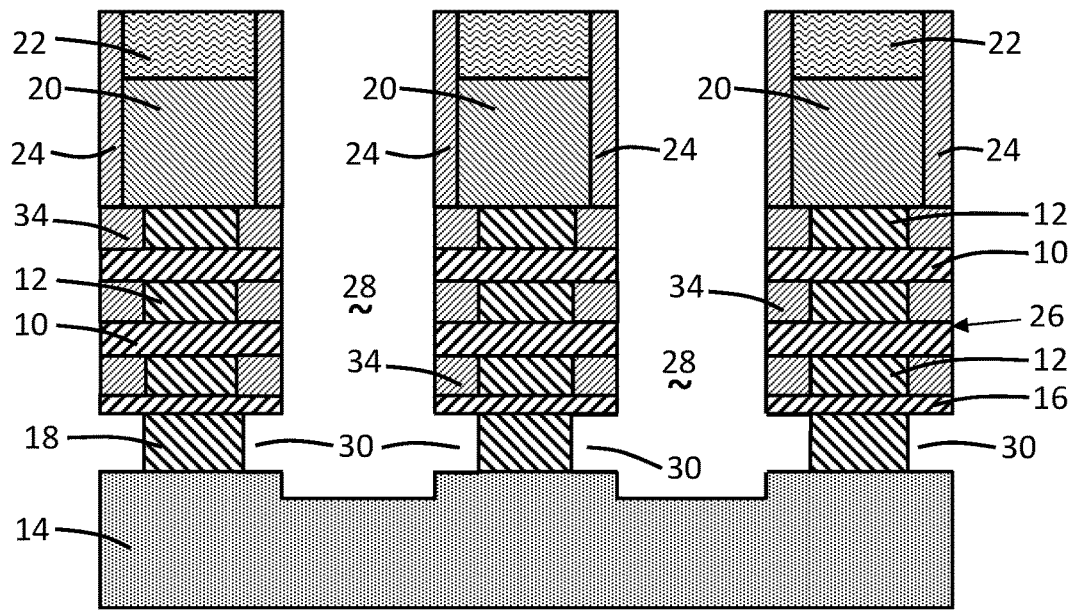

With reference to FIG. 5 in which like reference numerals refer to like features in FIG. 4 and at a subsequent fabrication stage of the processing method, dielectric spacers 34 are formed from the conformal dielectric layer 31 in the cavities 29 between adjacent pairs of the nanosheet channel layers 10, and the conformal dielectric layer 31 is removed from the cavities 30 between the etch block layer 16 and the substrate 14. The dielectric spacers 34 may be formed using an isotropic etching process that completely removes portions of the dielectric material of conformal dielectric layer 31 that are located outside of the cavities 29, and removes the dielectric material of conformal dielectric layer 31 from the cavities 30.

Figure 6:
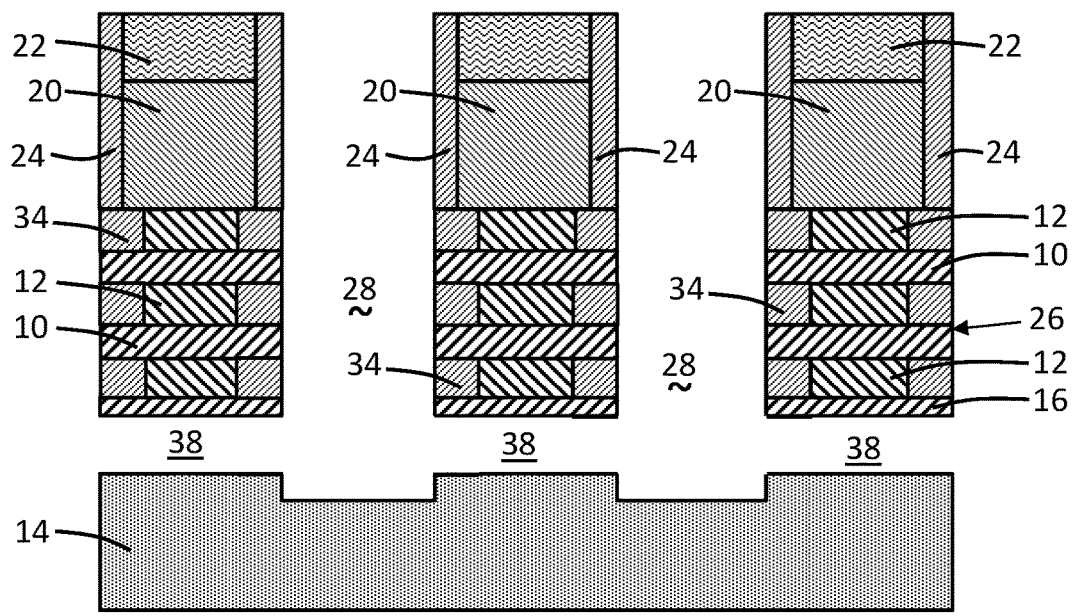

With reference to FIG. 6 in which like reference numerals refer to like features in FIG. 5 and at a subsequent fabrication stage of the processing method, the sacrificial layer 18 is completely removed with an etching process that etches the material constituting the sacrificial layer 18 selective to the material constituting the nanosheet channel layers 10 and etch block layer 16. The removal of the sacrificial layer 18 extends and merges the cavities 30 to form a cavity 38 that extends completely beneath each body feature 26. The cavity 38 is arranged vertically between the body feature 26 and the substrate 14. The dielectric spacers 34 inside the cavities 29 mask the sacrificial layers 12 from the etching process during the removal of the sacrificial layer 18, which has the same etching selectivity as the sacrificial layers 12. The etch block layer 16 masks the lowermost sacrificial layer 12 at the bottom of the body feature 26 during the removal of the sacrificial layer 18. The sacrificial gate structures 20, which overlap with the body features 26, support each body feature 26 from its ends and from above after the cavity 38 is formed by removing the sacrificial layer 18.

Figure 7:
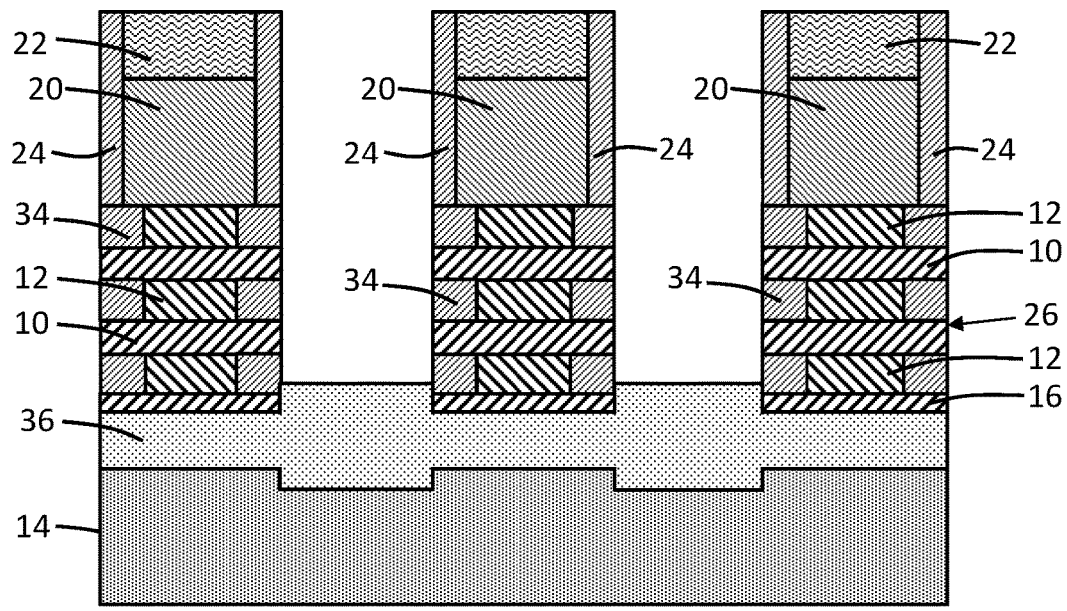

With reference to FIG. 7 in which like reference numerals refer to like features in FIG. 6 and at a subsequent fabrication stage of the processing method, the trenches 28 in the substrate 14 and the cavities 38 are concurrently filled with dielectric material to form a dielectric isolation region 36. The dielectric material constituting the dielectric isolation region 36 may be an oxide of silicon (e.g., silicon dioxide ($SiO_2$)) deposited by CVD and recessed by an etch-back process. The dielectric isolation region 36 conforms to the shape of the top surface of the substrate 14 as modified by the trenches 28 and the shape of the cavities 38. The dielectric isolation region 36 may be thicker in the trenches 28 than inside the cavities 38. The thickness of the dielectric isolation region 36 inside the cavities 38 may be equal to the thickness of the removed sacrificial layer 18.

Figure 8:
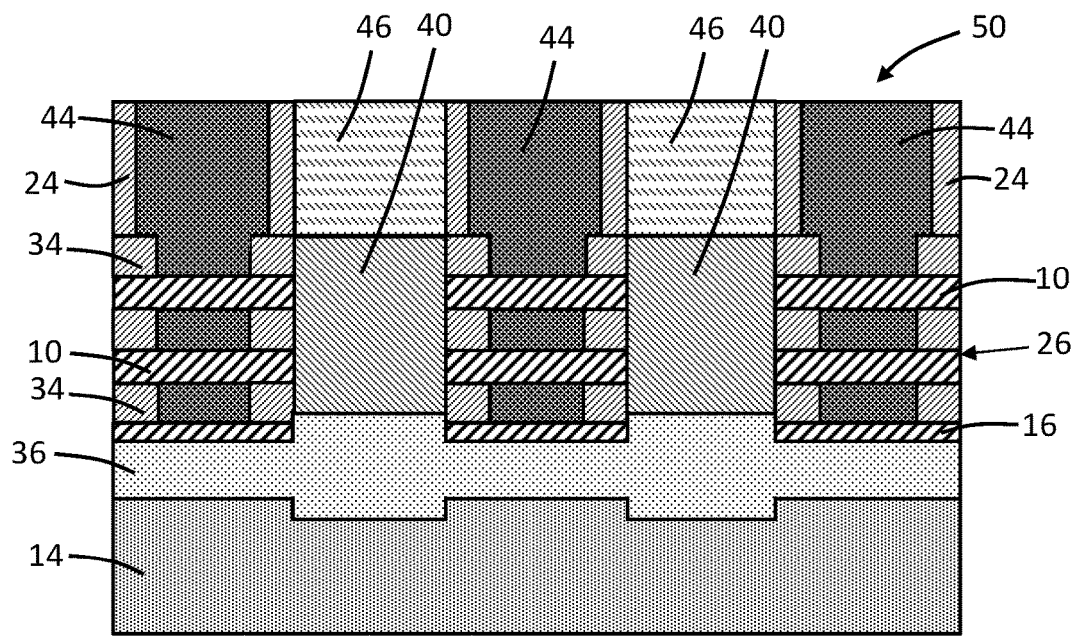

With reference to FIG. 8 in which like reference numerals refer to like features in FIG. 7 and at a subsequent fabrication stage of the processing method, source/drain regions 40 of a field-effect transistor 50 are formed adjacent to the side surfaces of each body feature 26 that are exposed between the sacrificial gate structures 20. The source/drain regions 40 are located on and above the dielectric isolation region 36. The term "source/drain region" as used herein refers to a doped region of semiconductor material that can function as either a source or a drain of a field-effect transistor. The source/drain regions 40 are physically connected with the nanosheet channel layers 10 and are physically isolated from the sacrificial layers 12 by the dielectric spacers 34.

The semiconductor material constituting the source/drain regions 40 may be formed using an epitaxial growth process in which the nanosheet channel layers 10 serve as a seed for the epitaxial growth process. The semiconductor material constituting the source/drain regions 40 may be heavily doped to have either p-type electrical conductivity or n-type electrical conductivity. In an embodiment, the source/drain regions 40 may be formed by a selective epitaxial growth (SEG) process in which semiconductor material nucleates for epitaxial growth on semiconductor surfaces (e.g., the nanosheet channel layers 10), but does not nucleate for epitaxial growth from insulator surfaces (e.g., dielectric caps 22, dielectric spacers 34, and dielectric isolation region 36). The dielectric isolation region 36 functions to block and prevent epitaxial growth of the semiconductor material from the substrate 14.

A gap-fill layer 46 is deposited and planarized to fill open spaces arranged between the sacrificial gate structures 20 that are not already occupied by the source/drain regions 40. The gap-fill layer 46 may be composed of a dielectric material, such as silicon dioxide ($SiO_2$), deposited by CVD and may be planarized using a chemical-mechanical polishing (CMP) process. The planarization removes the dielectric caps 22 and shortens the height of the sacrificial gate structures 20 and their associated dielectric spacers 24.

The sacrificial layers 12 and sacrificial gate structures 20 are removed with one or more etching processes that are selective to the nanosheet channel layers 10, and are replaced with functional gate structures 44 of the field-effect transistor 50 in a replacement gate process. The dielectric spacers 34 function to mask the source/drain regions 40 from the etching process removing the sacrificial layers 12. The gap-fill layer 46 also masks the source/drain regions 40 during the replacement gate process. After the sacrificial layers 12 are removed, spaces are opened that surround each of the nanosheet channel layers 10.

The functional gate structures 44 may include a gate dielectric layer composed of a dielectric material, such as a high-k dielectric, and a metal gate electrode composed of one or more barrier metal layers and/or work function metal layers, such as titanium aluminum carbide (TiAlC) or titanium nitride (TiN), and a metal gate fill layer that is comprised of a conductor, such as tungsten (W). The gate dielectric layer is arranged between the gate electrode and the exterior surface of the nanosheet channel layers 10. The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a semiconductor device.

The nanosheet channel layers 10 of the field-effect transistor 50 are arranged in a vertical stack. Sections of the functional gate structure 44 are located in the spaces formerly occupied by the removed sacrificial layers 12 and surround an exterior surface of the nanosheet channel layers 10 in a gate-all-around arrangement in which sections of the functional gate structure 44 are wrapped about the individual nanosheet channel layers 10. The nanosheet channel layers 10 function as channels for carrier flow that are formed during operation of the field-effect transistor 50.

The dielectric isolation region 36 extends laterally beneath both the body features 26 and the source/drain regions 40 to provide complete isolation of the field-effect transistor 50 from the substrate 14. The complete isolation is achieved with a considerably simplified process in comparison with conventional processes.

Middle-of-line (MOL) and back-end-of-line (BEOL) processing follow, which includes formation of contacts and wiring for the local interconnect structure overlying the device structure, and formation of dielectric layers, via plugs, and wiring for an interconnect structure coupled by the interconnect wiring with the functional gate structures 44 and source/drain regions 40 of the field-effect transistor 50.

Figure 9:
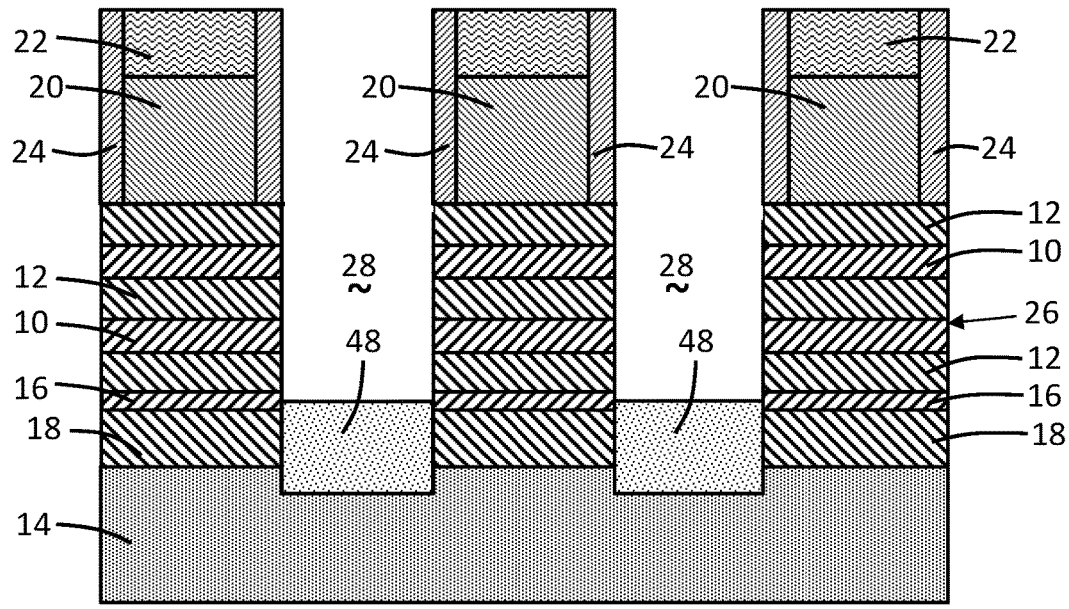
FIG. 9 is a cross-sectional view of a device structure at a fabrication stage subsequent to FIG. 2 of a processing method in accordance with embodiments of the invention.

With reference to FIG. 9 in which like reference numerals refer to like features in FIG. 2 and at a subsequent fabrication stage in accordance with alternative embodiments of the processing method, the process flow may be altered such that the cavities 30 are not formed between the etch block layer 16 and the substrate 14 and, as a consequence, the conformal dielectric layer 31 does not deposit in the cavities 30 only to be later removed. To that end, block masks 48 are formed in a lower portion of the trenches 28 with a height or thickness that is sufficient to mask or cover the side surfaces of the sacrificial layer 18 at the vertical sidewalls 25 before the etching process is performed that laterally recesses the sacrificial layers 12. The block masks 48 may be formed by depositing and etching-back a layer composed of a sacrificial material, such as amorphous carbon ($\alpha$-C), SiOH, or silicon dioxide ($SiO_2$). Because the cavities 30 are not formed as indentations in the vertical sidewalls 25 of the body feature 26, the sacrificial layer 18 is not restricted to be thicker than the sacrificial layers 12 to avoid pinch-off during the deposition of the conformal dielectric layer 31 because the block masks 48 isolate the sacrificial layers 18.

After the dielectric spacers 34 are formed, the block masks 48 are removed to re-expose the sacrificial layers 18, as shown in FIG. 5 absent the recessing. The process continues as described in connection with FIGS. 6-8.

Figure 10:
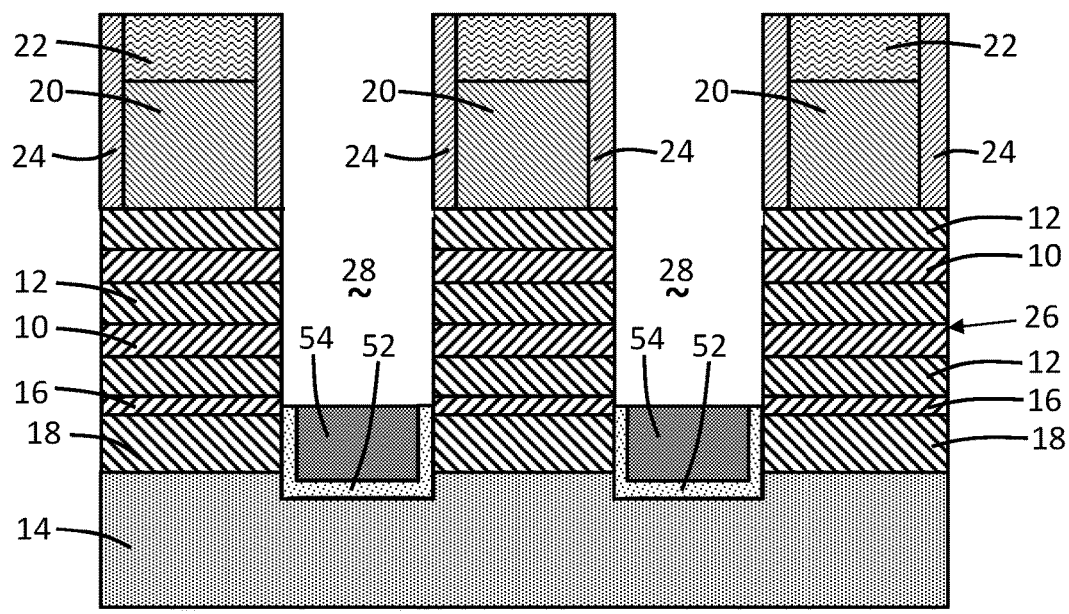
FIG. 10 is a cross-sectional view of a device structure at a fabrication stage subsequent to FIG. 2 of a processing method in accordance with embodiments of the invention.

With reference to FIG. 10 in which like reference numerals refer to like features in FIG. 2 and at a subsequent fabrication stage in accordance with alternative embodiments of the processing method, the process flow may be altered in another different manner such that the cavities 30 are not formed between the etch block layer 16 and the substrate 14 and, as a consequence, the conformal dielectric layer 31 does not deposit in the cavities 30 only to be later removed. To that end, a conformal dielectric layer 52 may be formed that coats the surfaces inside the trenches 28, sacrificial features 54 may be subsequently formed with a given thickness at the bottom of the trenches 28, and an etching process may be performed to remove the conformal dielectric layer 52 above the vertical level of the sacrificial features 54. The residual sections of the conformal dielectric layer 52 remaining, after the masked etching process, cover or mask the side surfaces of the sacrificial layer 18.

The conformal dielectric layer 52 may be composed of a sacrificial material, such as amorphous carbon ($\alpha$-C), SiOH, or silicon dioxide ($SiO_2$). The sacrificial features 54 are composed of a material, such as an organic planarization layer (OPL) material applied by spin coating, that can be removed selective to the material constituting the conformal dielectric layer 52. After the conformal dielectric layer 52 is etched to form the sacrificial features 54, the sacrificial features 54 may be removed by an ashing process using an oxygen plasma.

When the etching process is performed that laterally recesses the sacrificial layers 12, the side surfaces of the sacrificial layer 18 are masked or covered at the vertical sidewalls 25 by a block mask represented by the conformal dielectric layer 52 and is therefore not recessed. Because the cavities 30 are not formed as indentations in the vertical sidewalls 25 of the body feature 26, the sacrificial layer 18 is not restricted to be thicker than the sacrificial layers 12 to avoid pinch-off during the deposition of the conformal dielectric layer 31 because the block masks 48 isolate the sacrificial layers 18.

After the dielectric spacers 34 are formed, the conformal dielectric layer 52 is removed to re-expose the sacrificial layer 18, as shown in FIG. 5 absent the recessing. The process continues as described in connection with FIGS. 6-8.

Figure 11:
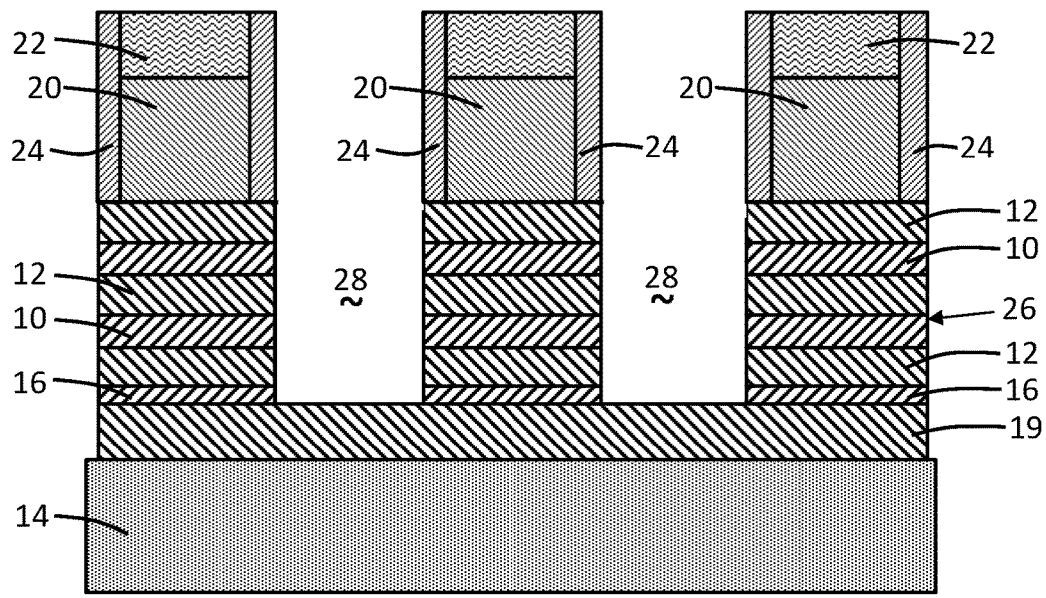
FIGS. 11-15 are cross-sectional views of a device structure at successive fabrication stages of the processing method in accordance with embodiments of the invention.

With reference to FIG. 11 in which like reference numerals refer to like features in FIG. 1 and at a subsequent fabrication stage in accordance with alternative embodiments of the processing method, the process flow may be altered in that the trenches 28 are not extended through the semiconductor layer 19 and into the substrate 14. Instead, the etching of the trenches 28 is terminated at the top surface of the semiconductor layer 19.

Figure 12:
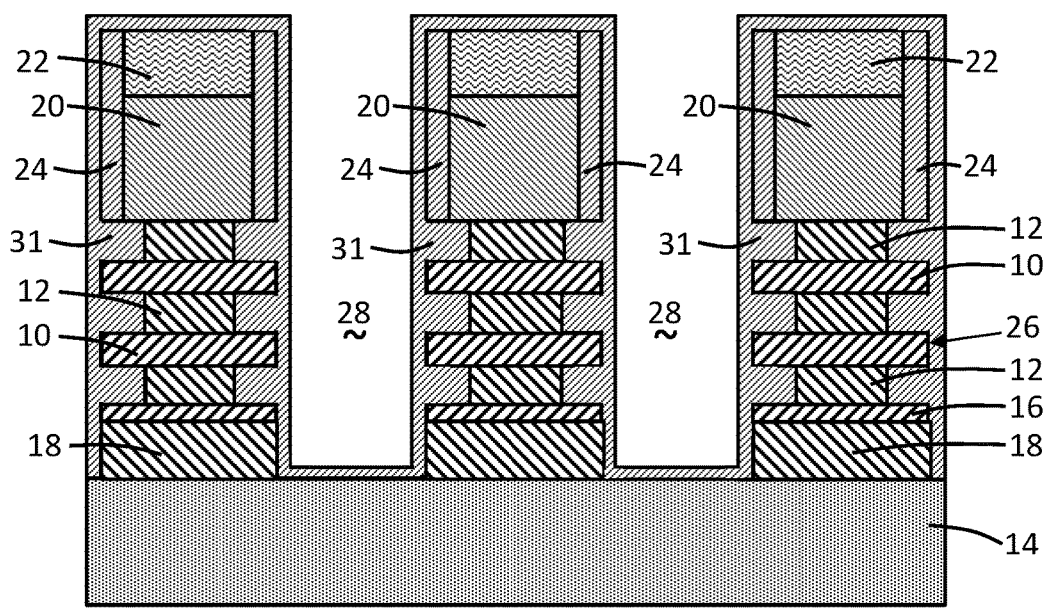

With reference to FIG. 12 in which like reference numerals refer to like features in FIG. 11 and at a subsequent fabrication stage of the processing method, the sacrificial layers 12 are laterally recessed with an isotropic etching process that etches the material constituting the sacrificial layers 12 selective to the material constituting the nanosheet channel layer 10 and the etch block layer 16, as described in the context of FIG. 3. The isotropic etching process may etch through the semiconductor layer 19 adjacent to the body features 26 to the substrate 14, which extends the depth of the trenches 28 through the semiconductor layer 19 (FIG. 11) and defines the sacrificial layer 18. While not shown, the sacrificial layer 18 may also be recessed laterally by the isotropic etching process. The conformal dielectric layer 31 is formed and fills the cavities 29, as described in the context of FIG. 4. Sections of the conformal dielectric layer 31 on adjacent sacrificial gate structures 20 reduce the width of the trenches 28 but do not close the trenches 28.

Figure 13:
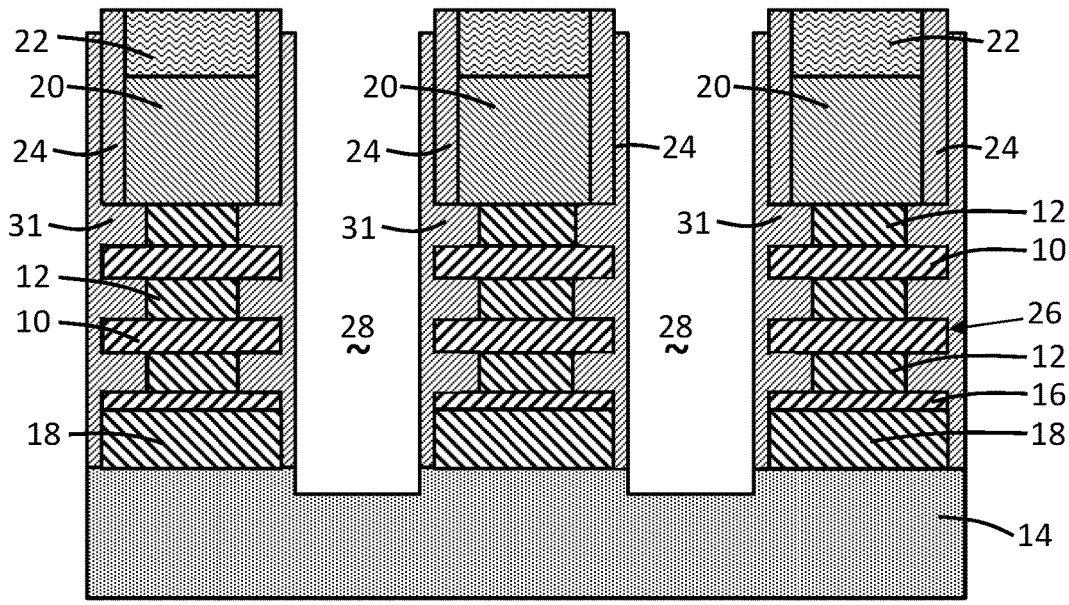

With reference to FIG. 13 in which like reference numerals refer to like features in FIG. 12 and at a subsequent fabrication stage of the processing method, the trenches 28 are extended vertically using one or more etching processes, such as reactive ion etching (RIE) processes, through the conformal dielectric layer 31 and to a shallow depth of penetration into the substrate 14. The extension of the trenches 28 may be self-aligned by the conformal dielectric layer 31 on adjacent sacrificial gate structures 20. The conformal dielectric layer 31 masks the body features 26 and the sacrificial layer 18.

Figure 14:
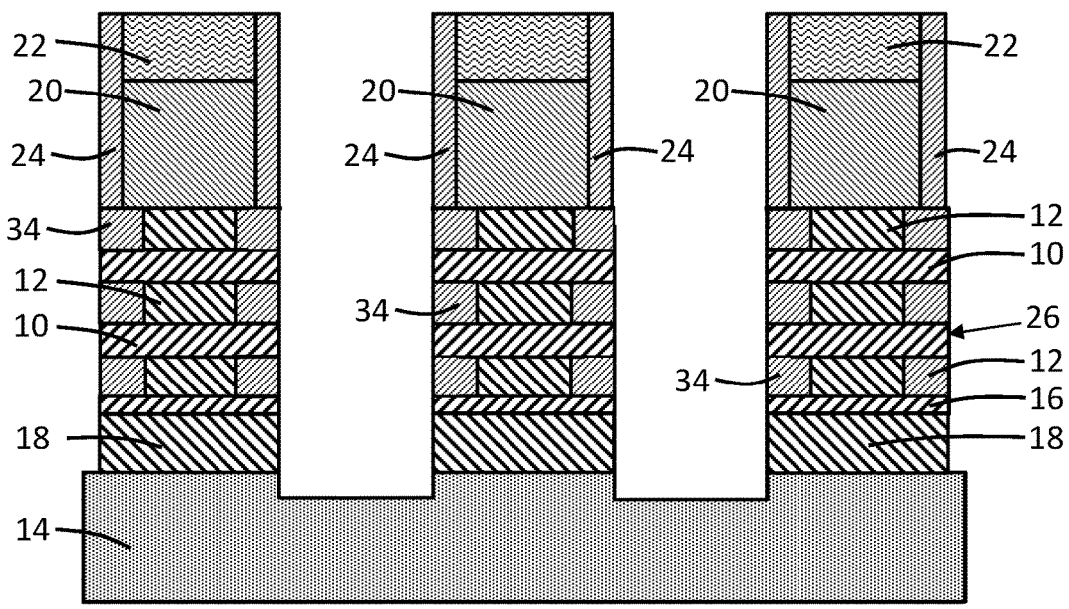

With reference to FIG. 14 in which like reference numerals refer to like features in FIG. 13 and at a subsequent fabrication stage of the processing method, the dielectric spacers 34 are formed from the conformal dielectric layer 31 deposited in the cavities 29 using an etching process, as described in the context of FIG. 5, that removes the conformal dielectric layer 31 from the vertical sidewalls 25. The etching process may be an isotropic wet chemical etching process. The removal of the conformal dielectric layer 31 exposes the sacrificial layer 18 for subsequent removal.

Figure 15:
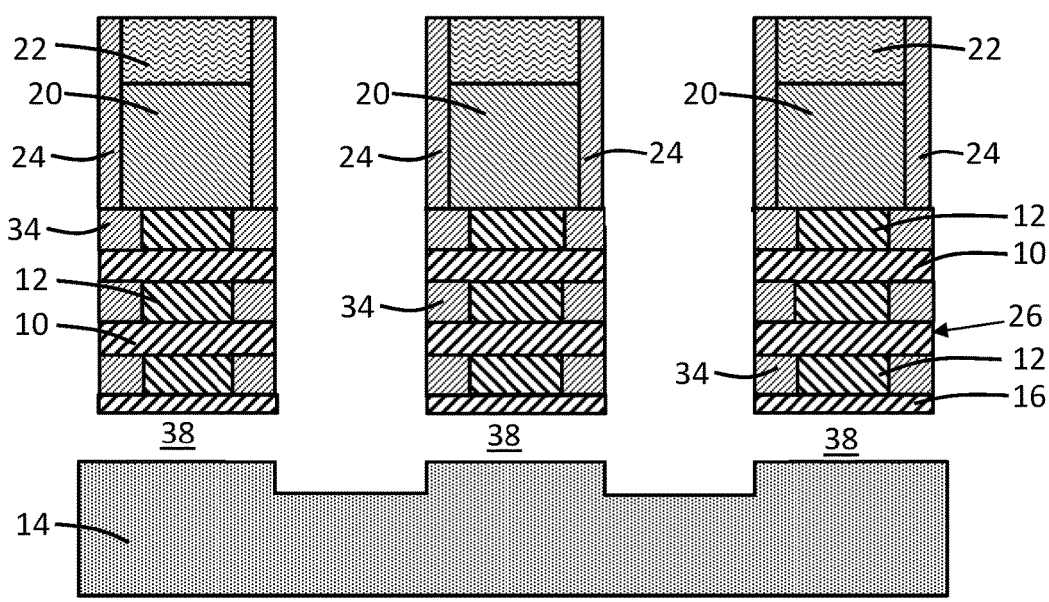

With reference to FIG. 15 in which like reference numerals refer to like features in FIG. 14 and at a subsequent fabrication stage of the processing method, after the dielectric spacers 34 are formed, the sacrificial layer 18 is removed to extend and merge the cavities 30 to form cavity 38 that extends laterally beneath the body features 26. The dielectric spacers 34 and etch block layer 16 mask and protect the sacrificial layers 12 during the etching process removing the sacrificial layer 18. The process may continue as described in connection with FIGS. 7 and 8.

Figure 16:
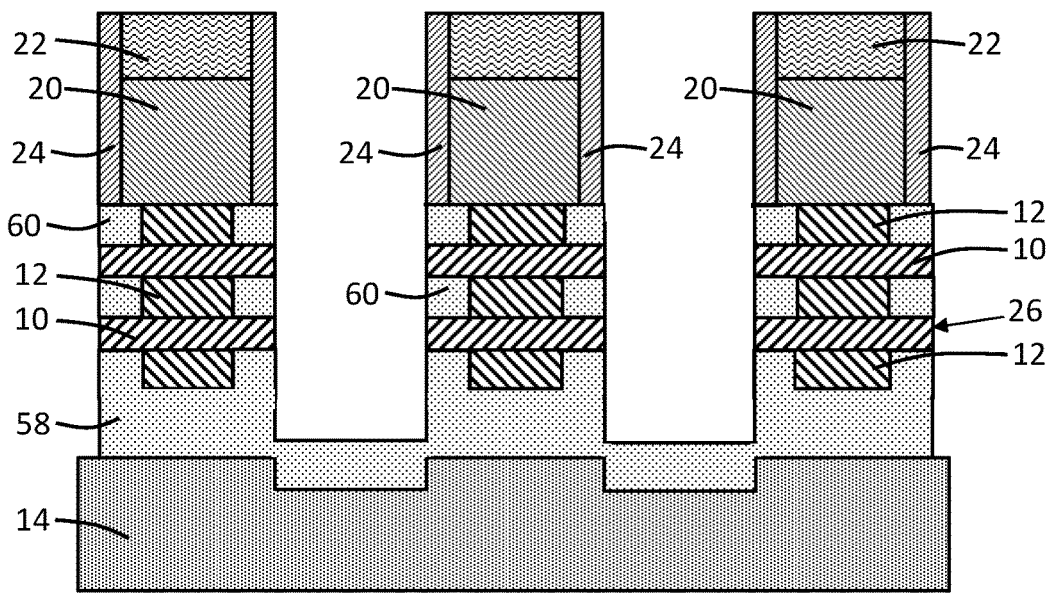
FIG. 16 is a cross-sectional view of a device structure at a fabrication stage subsequent to FIG. 15 of a processing method in accordance with embodiments of the invention.

With reference to FIG. 16 in which like reference numerals refer to like features in FIG. 15 and at a subsequent fabrication stage of the processing method in accordance with alternative embodiments, the etch block layer 16 and the dielectric spacers 34 may be removed using suitable etching processes. A conformal dielectric layer 58 may be deposited by, for example, atomic layer deposition (ALD) and isotropically etched to form dielectric spacers 60 that fill the cavities 29. The conformal dielectric layer 58 may be composed of a different material than the dielectric spacers 34 and, in an embodiment, may be composed of silicon nitride ($Si_3N_4$). The conformal dielectric layer 58 also fills the cavities 38 to define the dielectric isolation region 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a field-effect transistor, the method comprising:
    forming a body feature that includes a plurality of nanosheet channel layers and a plurality of first sacrificial layers that are alternatingly arranged with the nanosheet channel layers, the body feature located on a second sacrificial layer;
    recessing the first sacrificial layers relative to the nanosheet channel layers to form a plurality of first cavities indented into a sidewall of the body feature;
    forming a plurality of first dielectric spacers that fill the first cavities;

after forming the first dielectric spacers, removing the second sacrificial layer with an etching process to define a second cavity that extends completely beneath the body feature; and forming a dielectric layer in the second cavity, wherein the first sacrificial layers are comprised of a first silicon-germanium alloy having a first germanium content, and the second sacrificial layer is comprised of a second silicon-germanium alloy having a second germanium content that is equal to the first germanium content.

2. The method of claim 1 wherein the second sacrificial layer is recessed to form a third cavity when the first sacrificial layers are recessed.

3. The method of claim 1 further comprising:
before recessing the first sacrificial layers relative to the nanosheet channel layers, forming a block mask that masks the second sacrificial layer.

4. The method of claim 3 wherein the block mask is a section of a conformal layer, and the section of the conformal layer is comprised of a dielectric material.

5. The method of claim 4 wherein forming the block mask that masks the second sacrificial layer comprises:
forming the conformal layer on a sidewall shared by the body feature and the second sacrificial layer;
forming a sacrificial feature with a thickness that covers the sidewall of the second sacrificial layer; and
after forming the sacrificial feature, performing an etch back process to remove the conformal layer from a section of the sidewall exposed by the sacrificial feature.

6. The method of claim 4 wherein the block mask is a section of a non-conformal layer, and the non-conformal layer is comprised of a gap-fill material.

7. The method of claim 1 further comprising:
after forming the dielectric layer in the second cavity, removing the first sacrificial layers to form a plurality of spaces between adjacent pairs of the nanosheet channel layers; and
forming a gate structure at least in part located in the spaces.

8. The method of claim 1 wherein an etch block layer is arranged between the body feature and the second sacrificial layer, and the etch block layer covers the body feature when the second sacrificial layer is removed.

9. The method of claim 1 wherein the second sacrificial layer is arranged on a substrate between the body feature and the substrate, and a trench is etched through the second sacrificial layer to the substrate when the first sacrificial layers are recessed.

10. The method of claim 1 further comprising:
before forming the dielectric layer in the second cavity, removing the first dielectric spacers from the first cavities.

11. The method of claim 10 wherein the first dielectric spacers are comprised of a first dielectric material, the dielectric layer is comprised of a second dielectric material, and a plurality of second dielectric spacers comprised of the second dielectric material are formed in the first cavities when forming the dielectric layer in the second cavity.

12. The method of claim 11 wherein the first dielectric material is silicon dioxide and the second dielectric material is silicon nitride.

13. The method of claim 10 wherein an etch block layer is arranged between the body feature and the second sacrificial layer, and the etch block layer covers the body feature when removing the second sacrificial layer.

14. The method of claim 13 further comprising:
after forming the second cavity, removing the etch block layer before the dielectric layer is formed.

15. The method of claim 1 wherein forming the body feature comprises:
growing a first plurality of semiconductor layers and a second plurality of semiconductor layers that are alternatingly arranged with the first plurality of semiconductor layers; and
patterning the first plurality of semiconductor layers and the second plurality of semiconductor layers to form the nanosheet channel layers and the first sacrificial layers.

16. The method of claim 15 wherein the first plurality of semiconductor layers and the second plurality of semiconductor layers are grown on a third semiconductor layer, and the third semiconductor layer is patterned to form the second sacrificial layer when patterning the first plurality of semiconductor layers and the second plurality of semiconductor layers.

17. The method of claim 1 further comprising:
epitaxially growing a source/drain region adjacent to the body feature and directly connected with the nanosheet channel layers,
wherein the dielectric layer forms outside of the second cavity adjacent to the body feature on a surface of a substrate, and the dielectric layer that forms outside of the second cavity is arranged vertically between the source/drain region and the surface of the substrate.

18. The method of claim 17 wherein the dielectric layer in the second cavity is arranged vertically between the body feature and the substrate.

19. A method for forming a field-effect transistor, the method comprising:
forming a body feature that includes a plurality of nanosheet channel layers and a plurality of first sacrificial layers that are alternatingly arranged with the nanosheet channel layers, the body feature located on a second sacrificial layer;
recessing the first sacrificial layers relative to the nanosheet channel layers to form a plurality of first cavities indented into a sidewall of the body feature;
forming a plurality of first dielectric spacers that fill the first cavities;
after forming the first dielectric spacers, removing the second sacrificial layer with an etching process to define a second cavity that extends completely beneath the body feature;
forming a dielectric layer in the second cavity; and
epitaxially growing a source/drain region adjacent to the body feature and directly connected with the nanosheet channel layers,
wherein the dielectric layer forms outside of the second cavity adjacent to the body feature on a surface of a substrate, and the dielectric layer that forms outside of the second cavity is arranged vertically between the source/drain region and the surface of the substrate.

20. The method of claim 19 wherein the dielectric layer in the second cavity is arranged vertically between the body feature and the substrate.

* * * * *